United States Patent
Wang

(12) 
(10) Patent No.: US 6,258,712 B1
(45) Date of Patent: Jul. 10, 2001

(54) METHOD FOR FORMING A BORDERLESS CONTACT

(75) Inventor: Chien-Jung Wang, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 09/241,543

(22) Filed: Feb. 1, 1999

(30) Foreign Application Priority Data

Dec. 31, 1998 (TW) .................................... 87121964

(51) Int. Cl.[7] ...................... H01L 21/4763; H01L 21/469
(52) U.S. Cl. ........................ 438/634; 438/624; 438/626; 438/627; 438/639; 438/786; 438/787; 438/791
(58) Field of Search ..................................... 438/624, 626, 438/627, 631, 633, 634, 637, 639, 653, 786, 622, 787, 791

(56) References Cited

U.S. PATENT DOCUMENTS

| | | | |
|---|---|---|---|
| 5,565,529 | * 10/1996 | Babich | 525/431 |
| 5,834,845 | * 11/1998 | Stolmeijer | 257/752 |
| 6,020,258 | * 2/2000 | Yew et al. | 438/634 |
| 6,054,380 | * 4/2000 | Naik | 438/624 |

\* cited by examiner

*Primary Examiner*—John F. Niebling
*Assistant Examiner*—Ha Tran Nguyen
(74) *Attorney, Agent, or Firm*—Jiawei Huang; J.C. Patents

(57) ABSTRACT

A method of a self-alignment process to enhance the yield of borderless contact is described. The method provides a two-step, selective etching process, using the difference in the etching selectivities of the inter-metal dielectric layer and the barrier layer. The barrier layer is used as an etching stop layer, and a portion of the inter-metal dielectric layer is removed to form a contact window. The barrier layer and the inter-metal dielectric layer on the bottom of the contact window are removed, and then a borderless contact according to the invention is complete.

4 Claims, 3 Drawing Sheets

METHOD FOR FORMING A BORDERLESS CONTACT

CROSS-REFERENCE TO RELATED APPLICATION

This application claims the priority benefit of Taiwan application serial no. 87121964, filed Dec. 31, 1998.

BACKGROUND OF THE INVENTION

1. Field of the Invention

The present invention relates to a method for forming a semiconductor device. More particularly, the present invention relates to a method for forming a borderless contact.

2. Description of the Related Art

As the integration density of semiconductor devices increases, more circuit elements must to be packed in a unit surface area of the device substrate, and circuit elements such as interconnects are necessarily increased between MOS transistors of the IC device. In many highly integrated semiconductor devices, more than two levels of interconnecting metal layers are demanded, called multilevel metal interconnects (MLM).

In the conventional method, a landed contact with a contact window width that is less than the conductive line width is provided for preventing misalignment and to insure the connection between the contact and conductive line. The landed contact must use a larger surface area of the device substrate, so that it is difficult to enhance the integration density of semiconductor devices and the capital expenditure increases. As the integration of semiconductor devices is increased, instead of the landed contact, another conventional method for forming a borderless contact is provided. A borderless contact for which the conductive line width is substantially the same as the contact window width has been used in current semiconductor fabrication process in order to downsize the semiconductor devices. However, the over-etching due to misalignment leads to an inability of contact window to connect completely with the conductive line.

As semiconductor device integration continuously increases, device dimensions are necessarily accordingly reduced. Thus, a contact window in the device needs a more precise alignment to prevent an improper electrical coupling to the adjacent device element from occurring as a metallic material is filled into the contact window. The improper electrical coupling usually causes a short circuit in the device. For example, a contact window is desired to expose an interchangeable source/drain region but it may also expose a portion of a gate structure if a misalignment occurs. When the misalignment contact window is filled with metallic material, the interchangeable source/drain and the gate structure are improperly coupled, resulting in a short circuit. In order to enhance the process window and prevent a short circuit from occurring, a self-alignment contact technology is developed.

FIG. 1A is schematic, cross-sectional view showing a standard borderless contact. As shown in FIG. 1A, a plurality of conductive lines 102 are formed on a substrate 100, and the conductive lines 102 comprise a titanium/aluminum copper/titanium/titanium nitride multi-layer structure. The conductive lines 102 and the substrate 100 are covered by an inter-metal dielectric layer 104; the inter-metal dielectric layer 104 is made of silicon oxide. The inter-metal dielectric layer 104 covering the conductive lines 102 is removed by photolithography and etching to form a plurality of contact windows 106 and expose the conductive lines 102. A liner 108, made from titanium nitride, is formed as a diffusion barrier layer conformal to the substrate 100. Then, the contact windows 106 are filled with a conductive layer 110 made from tungsten.

FIG. 1B is schematic, cross-sectional view showing a worst case misalignment in a currently used borderless contact. As shown in FIG. 1B, a borderless contact process is performed to form a plurality of contact windows 106 that exposes only the conductive lines 102 on the substrate 100. However, once a misalignment occurs, the occurrence of over-etching due to misalignment is generated; not only the conductive lines 102 on the substrate 100 are exposed, but also the substrate 100 surface is exposed by the contact windows 106. If misalignment occurs in a conventional borderless contact process, the over-etching of contact formation etches through the inter-metal dielectric layer without obstruction. If the substrate 100 has completed the front end process before the step of forming the contact windows 106, the contact windows 106 in contact with the substrate 100 cause the resistance-capacitance (RC) of devices to increase, so that the device performance is reduced. Additionally, the occurrence of over-etching due to misalignment results in a leakage current, and therefore the yield is decreased.

SUMMARY OF THE INVENTION

Accordingly, the purpose of the present invention is to provide a method for a self-alignment process to enhance the yield of borderless contact. The method can improve the resistance-capacitance (RC) and avoid the leakage current.

To achieve these and other advantages and in accordance with the purpose of the invention, as embodied and broadly described herein, the invention provides a method for a self-alignment process to enhance the yield of borderless contact. A substrate is provided, a plurality of conductive lines are formed on the substrate. A first inter-metal dielectric layer is formed over the substrate; the surface level of the first inter-metal dielectric layer located between the conductive lines is substantially the same as the surface level of the conductive lines. A first barrier layer is formed on the conductive lines and the first inter-metal dielectric layer, wherein the each of the conductive lines has a second barrier layer formed thereon. A second inter-metal dielectric layer is formed on the first barrier layer, the second inter-metal dielectric layer is patterned to form an opening. The first barrier layer and the second barrier layer on the bottom of the opening are removed to expose the conductive lines. A liner is formed conformal to the substrate, and a conductive layer is formed over the substrate and within the opening.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
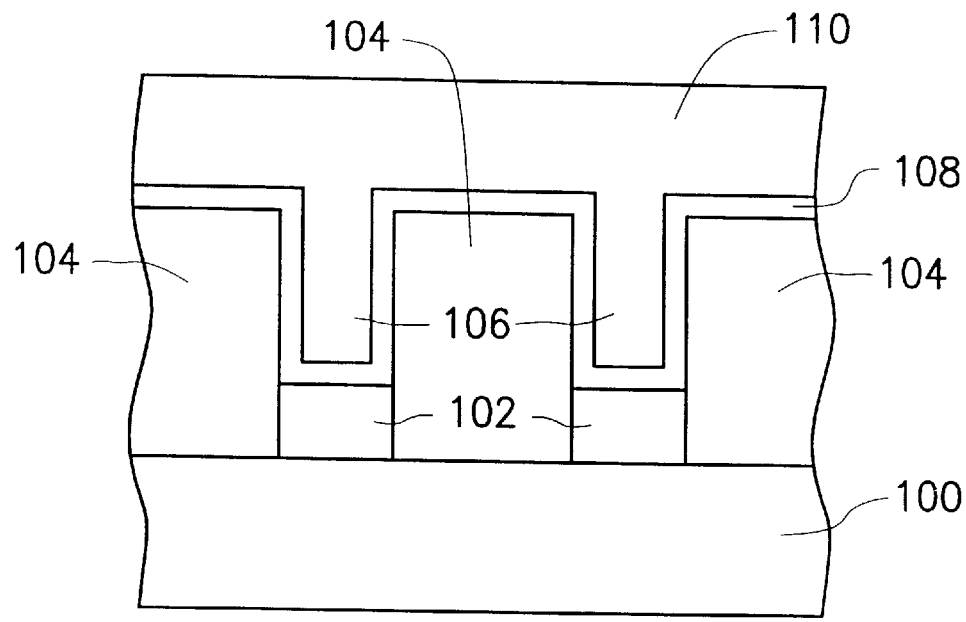
FIG. 1A is schematic, cross-sectional view showing a standard borderless contact.
Figure 1B:
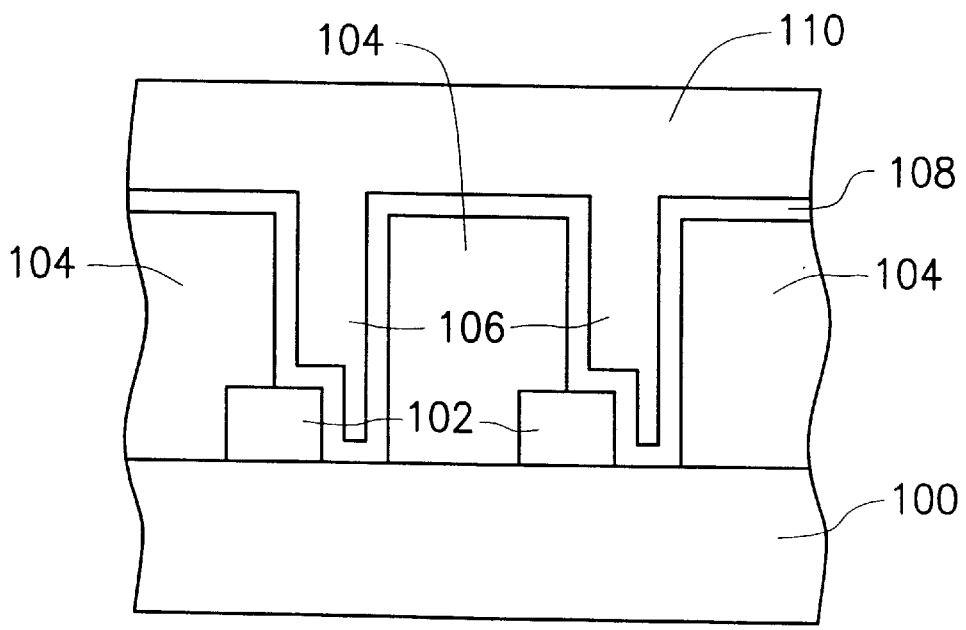
FIG. 1B is schematic, cross-sectional view showing a worse case of misalignment in a currently used borderless contact.

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2D are schematic, cross-sectional views showing the progression of manufacturing steps for a borderless contact according to the preferred embodiment of this invention.

Figure 2A:
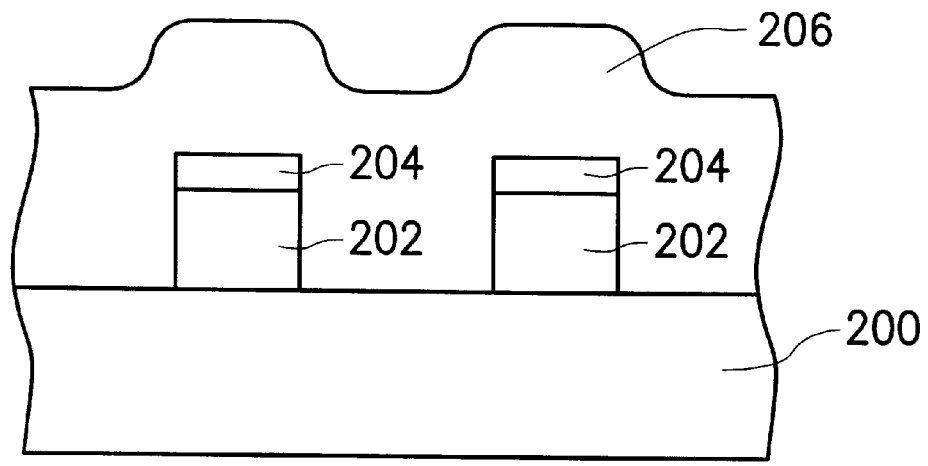
FIGS. 2A through 2D are schematic, cross-sectional views showing the progression of manufacturing steps for a borderless contact according to the preferred embodiment of this invention.

Referring to FIG. 2A, a substrate 200 is provided; and a plurality of conductive lines 202 are formed, for example, by sputtering on the substrate 200. The conductive lines 202 are such as titanium/aluminum copper/titanium/titanium nitride multi-layer structure. A first barrier layer 204 is formed, for example, by plasma enhanced chemical vapor deposition (PECVD) on the conductive lines 202 surface, respectively. The first barrier layer 204 is made of a material such as silicon nitride, silicon-oxynitride or boron nitride. A first inter-metal dielectric layer 206 is formed, for example, by plasma enhanced chemical vapor deposition or high density plasma chemical vapor deposition (HDPCVD) covering the conductive lines 202 and the substrate 200, the first inter-metal dielectric layer 206 is made of a material such as silicon oxide.

Figure 2B:
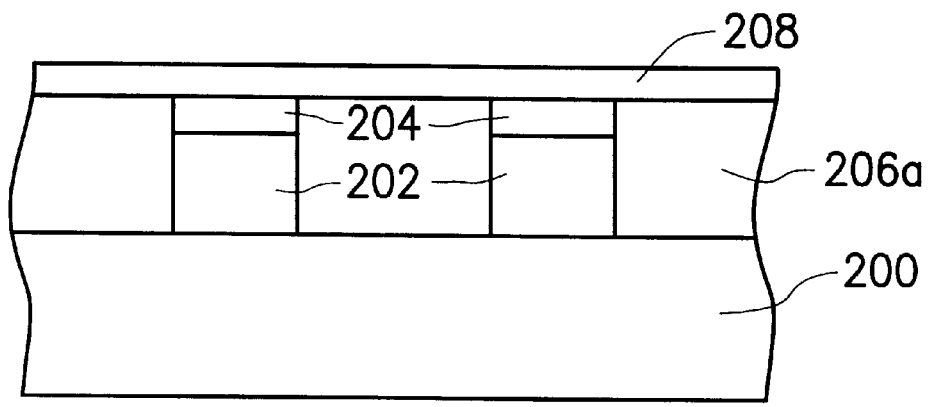

As shown in FIG. 2B, the first barrier layer 204 is used as a polishing stop layer, and a portion of the first inter-metal dielectric layer 206 is removed, for example, by chemical mechanical polishing (CMP) to form a first inter-metal dielectric layer 206a. The first inter-metal dielectric layer 206a surface level is substantially the same as the first barrier layer 204. A second barrier layer 208 is formed, for example, by plasma enhanced chemical vapor deposition on the first barrier layer 204 and the first inter-metal dielectric layer 206a. The second barrier layer 208 is made of a material such as silicon nitride, silicon-oxy-nitride or boron nitride.

Figure 2C:
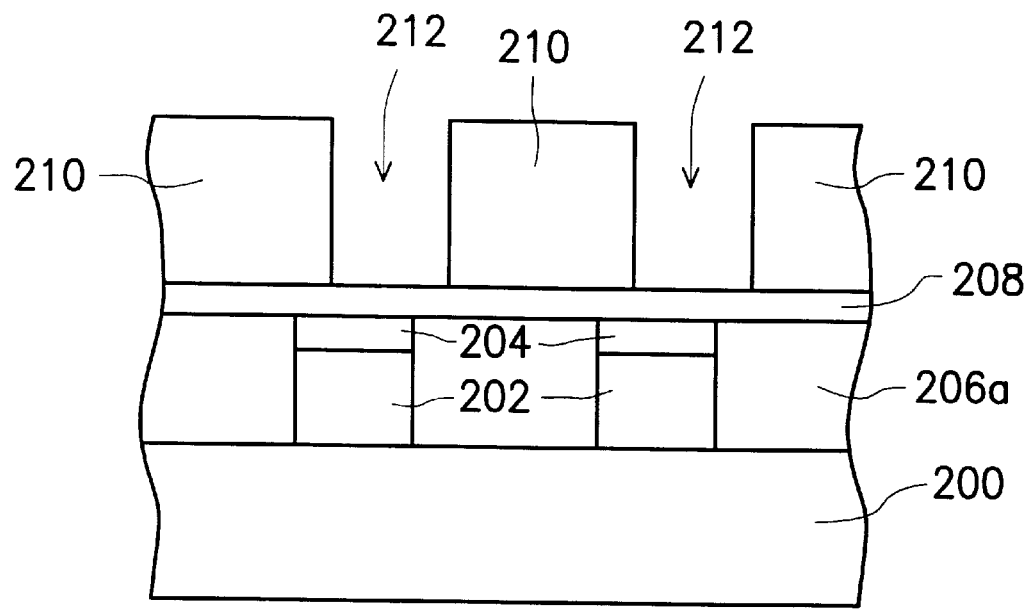

As shown in FIG. 2C, a second inter-metal dielectric layer 210 is formed, for example, by plasma enhanced chemical vapor deposition on the second barrier layer 208, the second inter-metal dielectric layer 210 is made of a material such as silicon oxide. The second barrier layer 208 is used as a etching stop layer, and an opening 212 is formed, for example, by photolithography and etching to expose the second barrier layer 208. The opening 212 is, for example, a contact window.

Figure 2D:
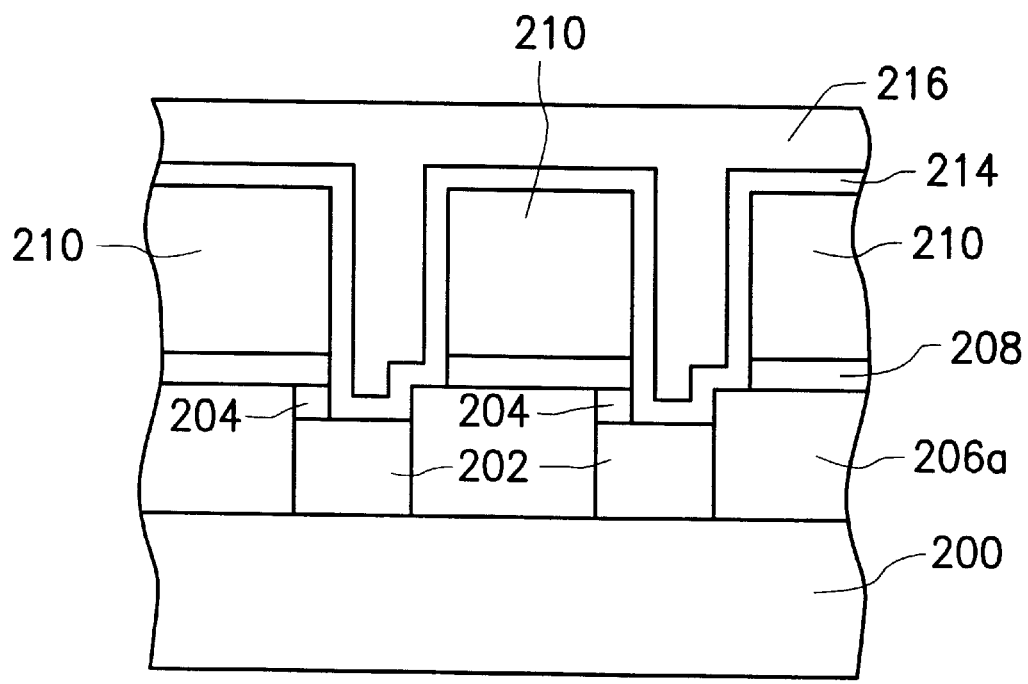

As shown in FIG. 2C and FIG. 2D, a portion of the first barrier layer 204 and the second barrier layer 208 on the bottom of the opening 212 are removed, for example, by dry etching to expose the conductive lines 202. The etching selectivities of the first barrier layer 204 and the second barrier layer 208 are different from the second inter-metal dielectric layer 210 and the first inter-metal dielectric layer 206a; therefore, the portion of the first barrier layer 204 and the second barrier layer 208 are removed to expose the conductive lines 202 and stop on the first inter-metal dielectric layer 206a. A liner 214 is formed, for example, by sputtering conformal to the substrate 200. The liner 214 is made of a material such as titanium nitride. Then, a conductive layer 216 is formed, for example, by chemical vapor deposition (CVD) over the substrate 200 and within the opening 212. The opening 212 is filled with a conductive layer 216 made of a material such as tungsten.

The invention provides a two-step, selective etching process which uses the different etching selectivities of the inter-metal dielectric layer and the barrier layer. The barrier layer is used as an etching stop layer, and a portion of the inter-metal dielectric layer is removed to form a contact window. The barrier layer and the inter-metal dielectric layer on the bottom of the contact window are removed, and then a self-alignment borderless contact according to the invention is complete.

In conclusion, the method according to the invention offers advantages over conventional methods:

(1) Since this barrier layer acts as the buffer in the two-step selective etching process, the over-etching of the inter-metal dielectric layer in a misalignment case can be effectively restrained so as to avoid device failure. The process window of borderless contact can be highly improved and process variation can be greatly reduced.

(2) The method can avoid the etching trench caused by over-etching the inter-metal dielectric layer in cases where the borderless contact is misaligned. It is very helpful for the planarization on the bottom of the contact and the step coverage of the barrier metal sputtering.

(3) If using fluorinated oxides as the inter-metal dielectric layer material, the barrier layer is also employed to act as a stop layer to prevent issues of fluorine diffusion.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a borderless contact wherein a substrate having a plurality of conductive lines is provided the conductive lines comprising a first barrier layer as an upper layer the method comprising the steps of:

forming a first inter-metal dielectric layer on the substrate and located between the conductive lines, wherein a surface level of the first inter-metal dielectric layer is substantially the same as a surface level of the first barrier layer;

forming a second barrier layer on the first inter-metal dielectric layer and the first barrier layer;

forming a second inter-metal dielectric layer on the second barrier layer;

a forming an opening penetrating through the second inter-metal dielectric layer, wherein the second barrier layer is used as an etching stop layer;

removing the first and the second barrier layers on a bottom of the opening, so as to expose the conductive lines;

forming a liner covering the second inter-metal dielectric layer and the exposed conductive lines exposed through the opening; and forming a conductive layer to fill the opening wherein the first barrier layer includes a material selected from a group consisting of silicon nitride, and silicon-oxy-nitride.

2. The method of claim 1, wherein the second barrier layer includes a silicon nitride layer.

3. The method of claim 1, wherein the second barrier layer includes a silicon-oxy-nitride layer.

4. The method of claim 1, wherein the second barrier layer includes a boron nitride layer.

* * * * *